US011021784B2

(12) United States Patent
Wang et al.

(10) Patent No.: US 11,021,784 B2
(45) Date of Patent: Jun. 1, 2021

(54) METHOD OF MASK LAYOUT (71) Applicant: Yungu (Gu'an) Technology Co., Ltd., Langfang (CN)

(72) Inventors: Enxia Wang, Langfang (CN); Lingtao Ou, Langfang (CN); Weili Li, Langfang (CN); Xiaopeng Lv, Langfang (CN); Shuaiyan Gan, Langfang (CN); Ya Wang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/816,276

(22) Filed: Mar. 12, 2020

(65) Prior Publication Data

US 2020/0208252 A1 Jul. 2, 2020

Related U.S. Application Data (63) Continuation of application No. PCT/CN2019/072960, filed on Jan. 24, 2019.

(30) Foreign Application Priority Data

Aug. 31, 2018 (CN) .......................... 201811014280.6

(51) Int. Cl.
C23C 14/04 (2006.01)
C23C 14/24 (2006.01)
H01L 51/00 (2006.01)

(52) U.S. Cl.
CPC ............ C23C 14/042 (2013.01); C23C 14/24 (2013.01); H01L 51/0011 (2013.01)

(58) Field of Classification Search
CPC .... C23C 14/042; C23C 14/24; H01L 51/0011
See application file for complete search history.

(56) References Cited

U.S. PATENT DOCUMENTS

2017/0268093 A1* 9/2017 Ji ........................ C23C 14/042

FOREIGN PATENT DOCUMENTS

| CN | 1722918 A | 1/2006 |
| CN | 102586726 A | 7/2012 |

(Continued)

OTHER PUBLICATIONS

CN First Office Action dated May 29, 2019 in the corresponding CN application(applicationNo. 2018110142280.6).

(Continued)

*Primary Examiner* — Vuthe Siek
(74) *Attorney, Agent, or Firm* — Kilpatrick Townsend & Stockton (57) ABSTRACT

The present disclosure relates to a method of a mask layout, including: providing a frame with preset areas arranged at intervals, a positioning area between two adjacent preset areas, and a fixed area provided to offset from the positioning area and each of the preset areas, and a distance between two adjacent preset areas being a first predetermined distance L1; providing a cover mask corresponding to the positioning area, and a distance between an edge of the cover mask and the center of the positioning area being a second predetermined distance L2; and providing an evaporation mask on the fixed area according to preset conditions, a distance between two adjacent fixed areas being a third predetermined distance L3, and the third predetermined distance L3 being equal to a difference between the first predetermined distance L1 and the second predetermined distance L2.

20 Claims, 7 Drawing Sheets

(56) References Cited

FOREIGN PATENT DOCUMENTS

| | | |
|---|---|---|
| CN | 102766841 A | 11/2012 |
| CN | 104317158 A | 1/2015 |
| CN | 104651778 A | 5/2015 |
| CN | 106676469 A | 5/2017 |
| CN | 206340548 U | 7/2017 |
| CN | 107523788 A | 12/2017 |
| CN | 105586568 B | 1/2018 |
| CN | 107723659 A | 2/2018 |
| CN | 207109080 U | 3/2018 |
| CN | 109182964 A | 1/2019 |
| JP | 2004346356 A | 12/2004 |
| KR | 20120123918 A | 11/2012 |
| WO | 2018045799 A1 | 3/2018 |

OTHER PUBLICATIONS

International Search Report dated May 22, 2019 in the corresponding international application(aplication No. PCT/CN2019/072960).
TW Office Action dated Aug. 29, 2019 with search report in the corresponding TW application (application No. 108103934).

\* cited by examiner

Providing a frame with preset areas arranged at intervals, a positioning area between two adjacent preset areas, and fixed areas provided offset from the positioning area and each of the preset areas, and a distance between the two adjacent preset areas being a first predetermined distance L1

Providing a cover mask corresponding to the positioning area, and a distance between an edge of the cover mask and the center of the positioning area being a second predetermined distance L2

Providing an evaporation mask on each of the fixed areas according to preset conditions, a distance between the two adjacent fixed areas being a third predetermined distance L3, and the third predetermined distance L3 being equal to a difference between the first predetermined distance L1 and the second predetermined distance L2; and the preset conditions comprise that the frame comprises a connection area for connecting the evaporation mask, the connection area is within each of the fixed areas, a distance between an edge of the connection area and an edge of the evaporation mask is a first distance D1, a distance between an edge of an evaporation area of the evaporation mask and the edge of the evaporation mask is a second distance D2, and the first distance D1 is smaller than the second distance D2

METHOD OF MASK LAYOUT

CROSS-REFERENCES TO RELATED APPLICATIONS

This application is a continuation of International Application No. PCT/CN2019/072960, filed on Jan. 24, 2019, which claims priority from Chinese patent application No. 201811014280.6, entitled "Method of Mask Layout", filed on Aug. 31, 2018, both of which are incorporated herein by reference in their entireties.

TECHNICAL FIELD

The present disclosure relates to the technical field of a display panel.

BACKGROUND

Due to its advantages, such as a self-luminousness, a small thinness, a low power consumption, a high contrast, a high color gamut, and a flexible display, an organic light emitting diode (abbreviated as OLED) display has been widely used in various electronic apparatus, such as a computer, a mobile phone and other electronic products. An OLED display device includes a cathode layer, an organic material functional layer, an anode layer, etc. The organic material functional layer generally uses a mask to evaporate an evaporation material to a preset position of an evaporation back plate by evaporation.

SUMMARY

An embodiment of the present disclosure provides a method of a mask layout. The method of a mask layout can ensure a masking accuracy of an evaporation mask and improve a layout density of evaporation masks, thereby increasing a yield of display panels.

An aspect of an embodiment of the present disclosure provides a method of a mask layout, including:

providing a frame with preset areas arranged at intervals, a positioning area between two adjacent preset areas, and a fixed area provided to offset from the positioning area and each of the preset areas, and a distance between two adjacent preset areas being a first predetermined distance L1; providing a cover mask corresponding to the positioning area, and a distance between an edge of the cover mask and the center of the positioning area being a second predetermined distance L2; and providing an evaporation mask on the fixed area according to preset conditions, a distance between two adjacent fixed areas being a third predetermined distance L3, and the third predetermined distance L3 being equal to a difference between the first predetermined distance L1 and the second predetermined distance L2; wherein the preset conditions include that the frame includes a connection area for connecting the evaporation mask, the connection area is within each of the fixed areas, a distance between an edge of the connection area and an edge of the evaporation mask is a first distance D1, a distance between an edge of an evaporation area of the evaporation mask and the edge of the evaporation mask is a second distance D2, and the first distance D1 is smaller than the second distance D2.

According to an aspect of an embodiment of the present disclosure, the first distance D1 is 1 to 1.5 mm.

According to an aspect of an embodiment of the present disclosure, the second distance D2 is greater than 1.5 mm.

According to an aspect of an embodiment of the present disclosure, the preset conditions further include that there is a partial overlap between the cover mask and the evaporation mask, a distance between the edge of the cover mask near the evaporation area and the edge of the evaporation area is a third distance D3, a distance between an edge of the positioning area and the edge of the cover mask is a fourth distance D4, and the third distance D3 is greater than or equal to the fourth distance D4.

According to an aspect of an embodiment of the present disclosure, a width of each of the fixed areas is smaller than a width of each of the preset areas.

According to an aspect of an embodiment of the present disclosure, the evaporation area includes an auxiliary pixel evaporation area, and a distance between an edge of the auxiliary pixel evaporation area and the edge of the evaporation mask is the second distance D2.

According to an aspect of an embodiment of the present disclosure, the frame includes a protrusion provided in each of the fixed areas and a groove provided in the positioning area, the evaporation mask is fixed on the protrusion, and the cover mask is provided in the groove.

According to an aspect of an embodiment of the present disclosure, a solder joint is provided within the connection area, the evaporation mask is fixed to the protrusion by the solder joint, and a distance between an edge of the solder joint and the edge of the evaporation mask is the first distance D1.

According to an aspect of an embodiment of the present disclosure, the evaporation mask is in a shape of a strip.

According to an aspect of an embodiment of the present disclosure, a plurality of preset areas are disposed at intervals in a width direction of the evaporation mask.

The method of a mask layout provided in the present disclosure uses the preset areas as a reference to accurately place and fix the evaporation mask on each of the fixed areas according to preset conditions. Under the premise of every evaporation mask satisfying the masking accuracy, the gap between two adjacent evaporation masks is beneficially reduced. Therefore, the layout number of the evaporation masks in a mask assembly can be greatly improved, and the masking accuracy is ensured, so that a larger number of display panels can be produced on a large glass substrate, which can increase a yield of the display panels and save costs.

BRIEF DESCRIPTION OF THE DRAWINGS

Features, advantages, and technical effects of exemplary embodiments of the present disclosure will be described below with reference to drawings.

DESCRIPTION OF REFERENCE SIGNS 101, frame; 101a, preset area; 101b, positioning area; 101c, fixed area; 101d, connection area; 1011, protrusion; 1012, groove; 1012a, long side;
102. evaporation mask; 1021; evaporation area; 1021a; auxiliary pixel evaporation area;
103. gap;
104. solder joint;
105. evaporation hole;
106. cover mask;
D1, first distance;
D2, second distance;
D3, third distance;
D4, fourth distance;
L1, first predetermined distance;
L2, second predetermined distance;
L3, third predetermined distance;
X, first direction; Y, second direction.

DETAILED DESCRIPTION OF THE INVENTION

Currently, existing structure design of the mask for organic material functional layer is inadequate, resulting in a low layout density of masks, which leads to a low utilization rate of an evaporation effective area of a substrate to be evaporated and seriously affects the number of screen bodies produced by the substrate to be evaporated.

An embodiment of the present disclosure is described further in detail below with reference to drawings and embodiments. The detailed description and drawings of the following embodiments are used to exemplarily illustrate the principle of the present disclosure, and cannot be used to limit the scope of the present disclosure, that is, the present disclosure is not limited to the described embodiments.

In the description of the present disclosure, it should be noted that, unless otherwise stated, the meaning of "a plurality" is two or more; the terms "upper", "lower", "left", "right", "inner", "outer", "front", "rear", "head", "tail", etc. indicating the directions or positional relationships are only for the convenience of describing the present disclosure and simplifying the description, do not indicate or imply that the device or element referred to must have a specific orientation, structure and operation in a specific orientation, and cannot be understood as a limitation on the present disclosure. In addition, the terms "first", "second", etc. are used for descriptive purposes only, and should not be interpreted as indicating or implying relative importance.

The orientation words appearing in the following description are directions shown in the drawings, and do not limit the specific structure of the mask assembly of the present disclosure. In the description of the present disclosure, it should also be noted that the terms "installation", "connection", and "attachment" should be understood in a broad sense unless otherwise specified and limited. For example, it may be a fixed connection or a detachable connection, or an integral connection; it can be a direct connection or indirect connection through an intermediate medium. For those of ordinary skill in the art, specific meanings of the above terms in the present disclosure may be understood according to specific situations.

In order to better understand the present disclosure, a method of a mask layout according to an embodiment of the present disclosure is described in detail below with reference to FIGS. 1 to 4.

Figure 1:
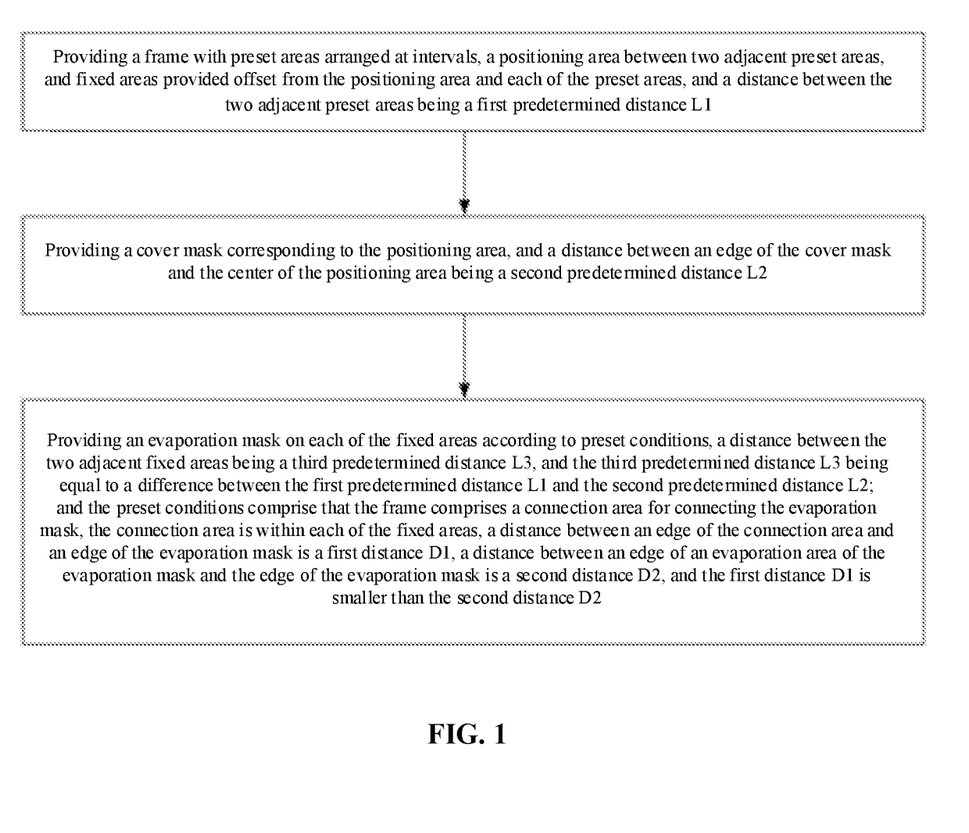
FIG. 1 is a flowchart of a method of a mask layout according to an embodiment of the present disclosure.
Figure 2:
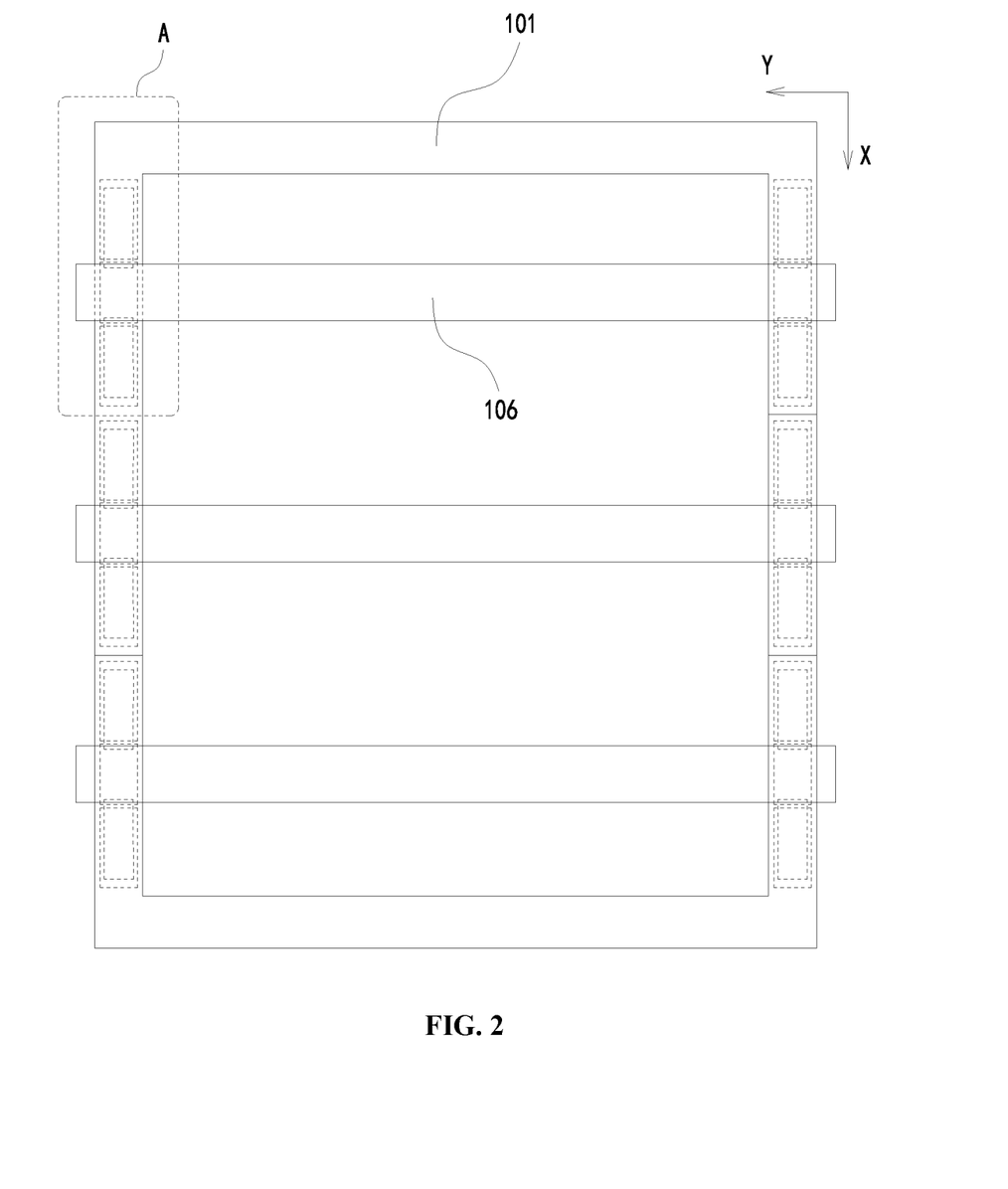
FIG. 2 is a schematic view of an assembly structure of a frame and a cover mask according to an embodiment of the present disclosure.
Figure 3:
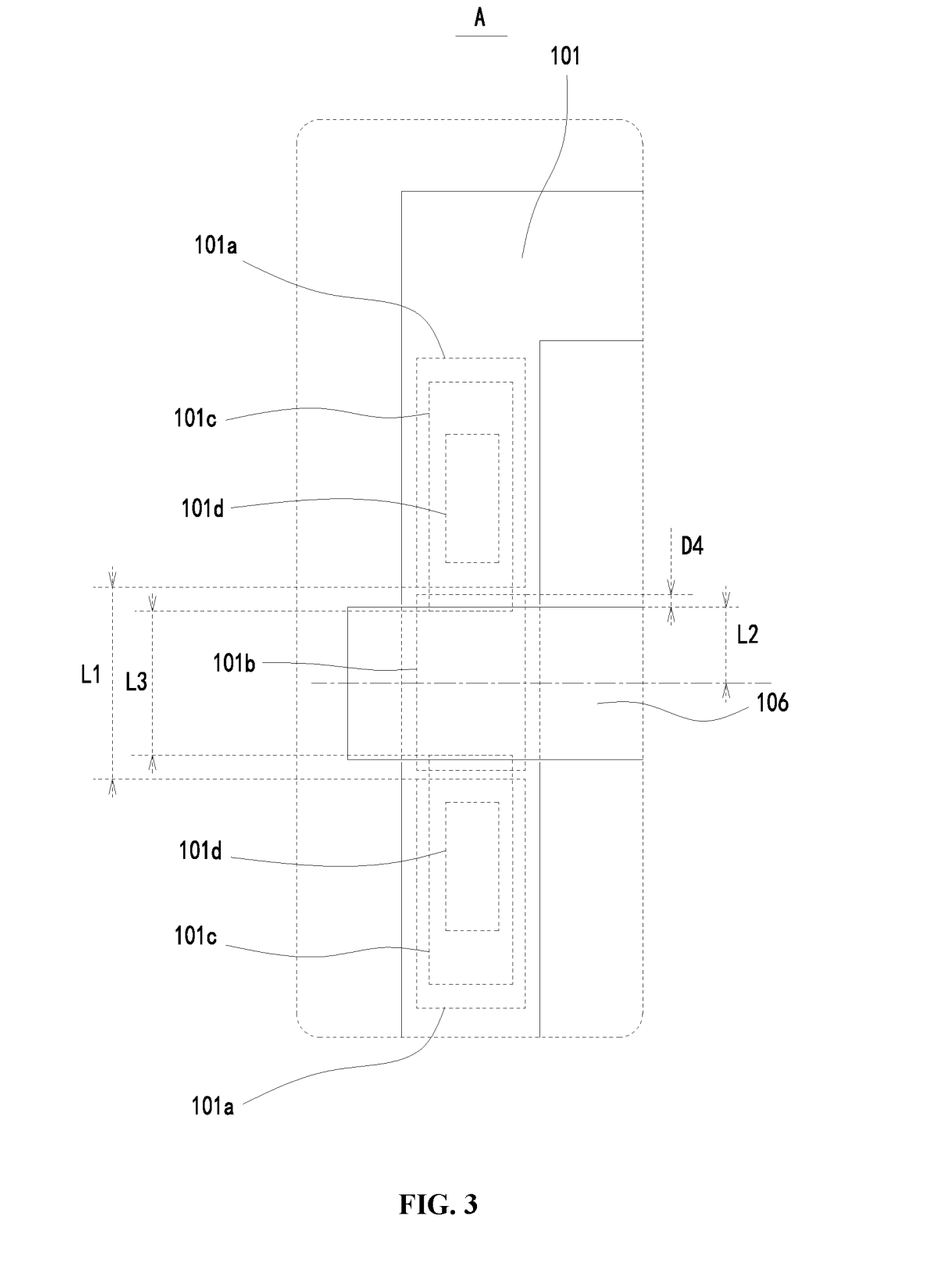
FIG. 3 is an enlarged schematic view of A in FIG. 2.

Referring to FIG. 1 to FIG. 3, an embodiment of the present disclosure provides a method of a mask layout, which includes steps as follows.

A frame 101 is provided. The frame 101 includes preset areas 101a arranged at intervals, a positioning area 101b between two adjacent preset areas 101a, and a fixed area 101c provided to offset from the positioning area 101b and each of the preset areas 101a. A distance between two adjacent preset areas 101a is a first predetermined distance L1. Referring to FIG. 3, the offset between the fixed area 101c and each of the preset areas 101a, and the offset between the fixed area 101c and the positioning area 101b in this embodiment respectively refer to that the fixed area 101c and each of the preset areas 101a do not overlap with each other or only partially overlap in a first direction X, and the fixed area 101c and the positioning area 101b do not overlap each other or only partially overlap each other in the first direction X.

A cover mask 106 is provided corresponding to the positioning area 101b, and a distance between an edge of the cover mask 106 and the center of the positioning area 101b is a second predetermined distance L2.

The evaporation mask 102 is provided in the fixed area 101c according to preset conditions, a distance between two adjacent fixed areas 101c is a third predetermined distance L3, and the third predetermined distance L3 is equal to a difference between the first predetermined distance L1 and the second predetermined distance L2.

The preset conditions include that the frame 101 includes a connection area 101d for connecting the evaporation mask 102, the connection area 101d is within each of the fixed areas 101c, a distance between an edge of the connection area 101d and an edge of the evaporation mask 102 is a first distance D1, a distance between an edge of an evaporation area 1021 of the evaporation mask 102 and the edge of the evaporation mask 102 is a second distance D2, and the first distance D1 is smaller than the second distance D2.

The preset areas 101a in the above embodiment are used as a reference area for placing the evaporation mask 102. The positioning area 101b is used to provide precise positioning for placing the cover mask 106. Each of the fixed areas 101c is an area for finally fixing the evaporation mask 102. The preset areas 101a, the positioning area 101b, the fixed areas 101c, and the connection area 101d are the areas shown by dashed boxes in FIG. 2. Each of the above areas is a virtual area and does not limit the structure of the frame 101. After the evaporation mask 102 is provided in each of the fixed areas 101c, a gap between two adjacent evaporation masks 102 is related to the third predetermined distance L3. The gap between the two adjacent evaporation masks 102 is smaller than the first predetermined distance L1.

The method of a mask layout provided in the present disclosure uses the preset areas 101a as a reference to accurately place and fix the evaporation mask on each of the fixed areas 101c according to preset conditions. Under the premise of every evaporation mask 102 satisfying the masking accuracy, the gap between the two adjacent evaporation masks 102 is beneficially reduced. Therefore, the layout number of the evaporation masks 102 in a mask assembly can be greatly improved, and the masking accuracy is ensured, so that a larger number of display panels can be produced on a large glass substrate, which can increase a yield of the display panels and save costs.

Figure 4:
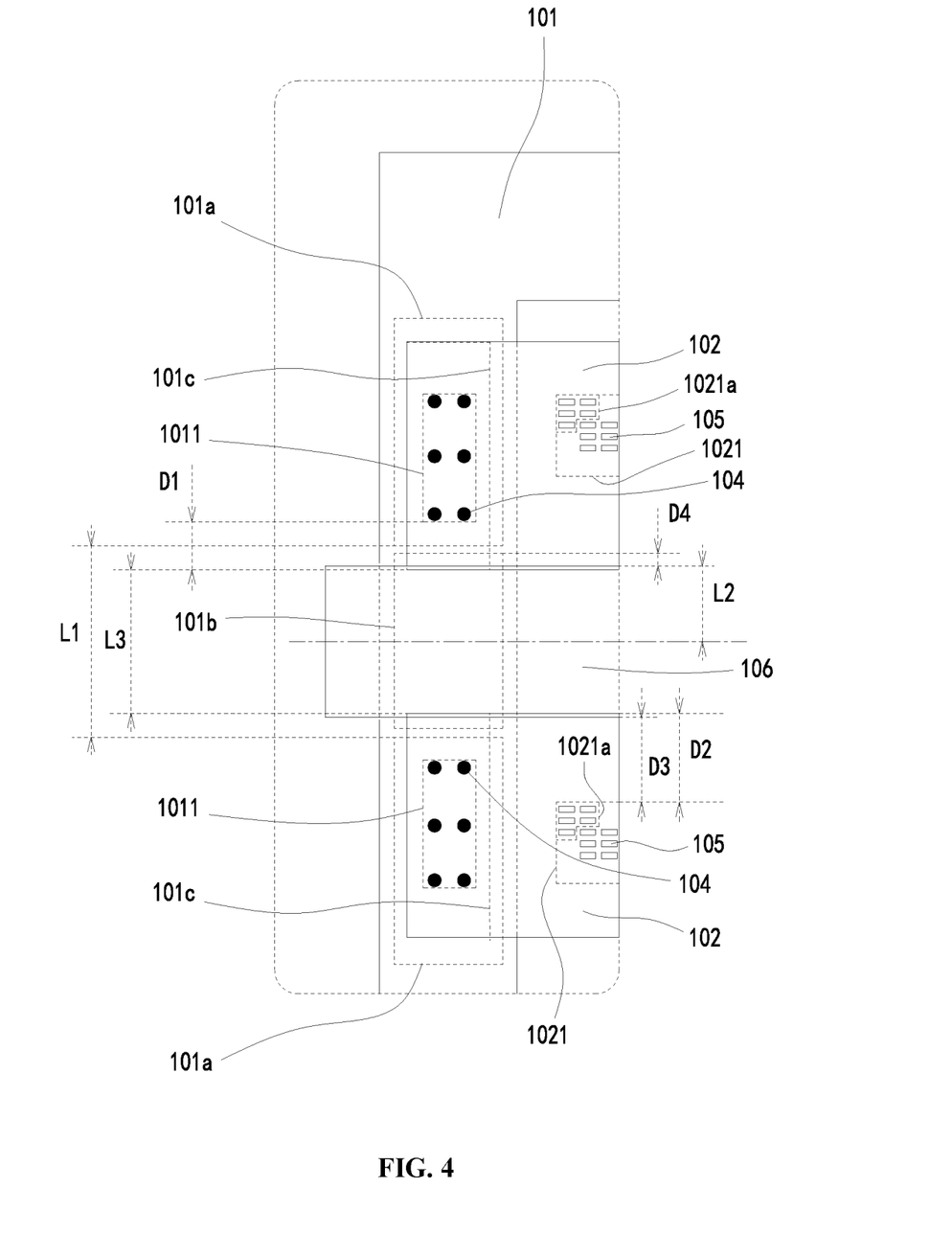
FIG. 4 is a schematic view of a partial assembly structure of a frame, an cover mask, and an evaporation mask in an embodiment of the present disclosure.

In an embodiment, referring to FIG. 4, the first distance D1 is 1 to 1.5 mm. Preferably, the first distance D1 is 1 to 1.1 mm. The second distance D2 is greater than 1.5 mm. In this way, the masking accuracy of each of the evaporation masks 102 can be ensured, and the possibility of the edge warping of each of the evaporation masks 102 can be reduced.

In the embodiment, the preset conditions further include that there is a partial overlap between the cover mask 106 and the evaporation mask 102, and a distance between the edge of the cover mask 106 near the evaporation area 1021 and the edge of the evaporation area 1021 is a third distance D3, a distance between the edge of the positioning area 101b and the edge of the cover mask 106 a fourth distance D4, and the third distance D3 is greater than or equal to the fourth distance D4. In this way, the gap between two evaporation masks 102 can be reduced, or the size of each of the evaporation masks 102 can be reduced, and a larger number of evaporation masks 102 can be provided in a unit area, thereby improving the layout rate per unit area of evaporation masks 102. In an embodiment, the third distance D3 is 0.3 to 0.5 mm, and the fourth distance D4 is 0.3 mm.

In the embodiment, a width of each of the fixed areas 101c is smaller than a width of each of the preset areas 101a. Referring to FIG. 2, a size of the fixed area 101c in the first direction X is a width size. A size of the preset area 101a in the first direction X is a width size. Thus, in the embodiment, the size of the evaporation mask 102 corresponds to the size of the fixed area 101c, so the size of the evaporation mask 102 itself in the first direction X can be reduced, and a larger number of evaporation masks 102 can be provided in a unit area to increase the layout rate per unit area of the evaporation masks 102.

In the embodiment, the evaporation area 1021 includes an auxiliary pixel evaporation area 1021a. A distance between the edge of the auxiliary pixel evaporation area 1021a and the edge of the evaporation mask 102 is the second distance D2. The auxiliary pixel evaporation area 1021a provided on each of the evaporation masks 102 is used to evaporate an auxiliary pixel. The evaporation area 1021 of the evaporation mask 102 further includes a display pixel evaporation area adjacent to the auxiliary pixel evaporation area 1021a. The display pixel evaporation area provided on the evaporation mask 102 is used to evaporate the display pixel.

In the embodiment, the frame 101 includes a protrusion 1011 provided in each of the fixed areas 101c and a groove 1012 provided in the positioning area 101b. The evaporation mask 102 is fixed to the protrusion 1011, and the covering mask 106 is disposed in the groove 1012. The distance between the edge of the cover mask 106 and the center of the groove 1012 is the second predetermined distance L2.

In an embodiment, a solder joint 104 is provided within the connection area 101d. the evaporation mask 102 is fixed to the protrusion 1011 by the solder joint. The distance from an edge of the solder joint 104 to the edge of the evaporation mask 102 is the first distance D1.

In an embodiment, the evaporation mask 102 is a bar-shaped structure having a predetermined width and length. The plurality of preset areas 101a are disposed at intervals along the width direction of the evaporation mask 102.

In order to better understand the present disclosure, the mask assembly formed after the layout of the evaporation masks 102 according to the method of a mask layout in an embodiment of the present disclosure is described in detail below with reference to FIGS. 5 to 7.

Figure 5:
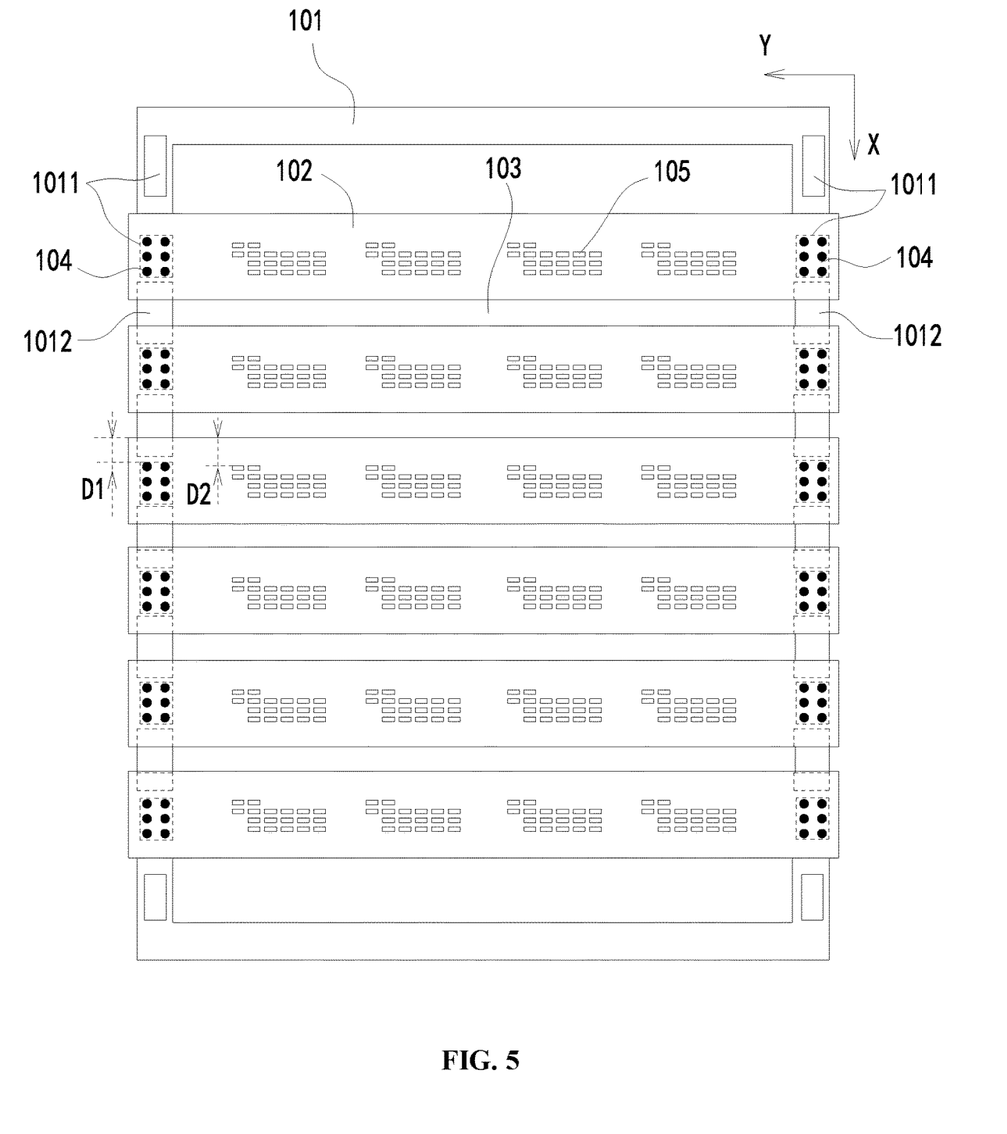
FIG. 5 is a schematic partial structural view of a mask assembly according to an embodiment of the present disclosure.

FIG. 5 shows a partial structure of a mask assembly according to an embodiment of the present disclosure. Referring to FIG. 5, the mask assembly includes the frame 101, the evaporation masks 102, and the solder joints 104. The frame 101 has a box-shaped structure. The number of evaporation masks 102 is plural. A plurality of evaporation masks 102 are sequentially disposed on the frame 101 along the first direction X. A gap 103 is formed between two adjacent evaporation masks 102. The number of solder joints 104 is plural, and the solder joints 104 fix the evaporation masks 102 to the frame 101. In each of the evaporation masks 102, the shortest first distance D1 in the first direction X lies between the solder joint 104 closest to the gap 103 and the edge of the evaporation mask 102. Each of the evaporation masks 102 includes a plurality of evaporation holes 105. The shortest second distance D2 in the first direction X lies between the evaporation hole 105 closest to the gap 103 and the edge of the evaporation mask 102. The first distance D1 is smaller than the second distance D2.

An organic light emitting display panel has a stacked structure. In the stacked structure, an emission layer is inserted between an anode and a cathode and displays color based on the principle that holes and electrons injected into the emission layer from the anode and the cathode emit light combines the emitting light. In the embodiment, an emissive layer material is evaporated by the evaporation masks 102 to manufacture the organic light emitting display panel.

Generally, the organic light emitting display panel is fabricated on a large glass substrate, and the large glass substrate can form multiple organic light emitting display panels at the same time. Cutting is performed after forming a plurality of organic light emitting display panels. In the process of evaporating a light-emitting material, the mask assembly is corresponded to the large glass substrate, and the light-emitting material is evaporated onto the large glass substrate via the evaporation holes 105 of the mask assembly.

The mask assembly of the embodiment includes the frame 101. The frame 101 generally has a box-shaped structure. A hollow area of the box-shaped structure is provided corresponding to an effective evaporation area on the large glass substrate. A plurality of organic light-emitting display panels formed by evaporation are located in the evaporation effective area. FIG. 5 schematically illustrates the rectangular frame 101, but the shape of the frame 101 in the embodiment is not limited to a rectangle, and may be other shapes. The frame 101 is used for supporting and fixing the plurality of evaporation masks 102.

The plurality of evaporation masks 102 in the embodiment are sequentially disposed on the frame 101 along the first direction X. Each of the evaporation masks 102 may be a fine metal mask (FMM), which has a thin thickness, a small thermal expansion coefficient, and high evaporation accuracy. Each of the evaporation masks 102 has a plurality of evaporation holes 105. One evaporation hole 105 can evaporate more than one pixel on the glass substrate. The light-emitting material is evaporated onto the glass substrate via the evaporation hole 105 to form a light-emitting pixel.

In the embodiment, there is usually the gap 103 between the evaporation masks 102 arranged in order in the first direction X. The gap 103 cannot usually be made very small. A larger gap 103 will reduce the number of evaporation masks 102 arranged in a unit area on the frame 101, resulting in fewer organic light emitting display panels produced on the large glass substrate.

In the second direction Y, each of the evaporation masks 102 has opposite ends. In order to fix the evaporation masks 102 and the frame 101, the evaporation masks 102 are usually welded to the frame 101. Therefore, the plurality of solder joints 104 are distributed at both ends of each of the evaporation masks 102 to fix the evaporation masks 102 on the frame 101.

As shown in FIG. 5, in the first direction X, each evaporation mask 102 has two opposite edges. In the X direction, there are two distances between the outermost solder joint 104 of the plurality of solder joints 104 on each evaporation mask 102 and both edges of the evaporation mask 102. The shortest one of the two distances is the first distance D1 described above. In the Y direction, there are two distances between the outermost evaporation hole 105 of the plurality of evaporation holes 105 on each evaporation mask 102 and both edges of the evaporation mask 102. The shortest one of the two distances is the second distance D2 described above.

In an embodiment, the first distance D1 is 1 to 1.5 mm, and the second distance D2 is greater than 1.5 mm. In this way, the masking accuracy of each of the evaporation masks 102 can be ensured, and the possibility of the edge warping of each of the evaporation masks 102 can be reduced.

In the mask assembly and the evaporation method provided in the present disclosure, the structure of the evaporation mask 102 is reasonable, and the gap 103 between two adjacent evaporation masks is reduced while satisfying the masking accuracy of the evaporation mask 102. Therefore, the layout number of the evaporation masks 102 in the mask assembly can be greatly improved, so that a larger number of display panels can be produced on a large glass substrate, which can increase a yield of the display panels and save costs.

With continued reference to FIG. 5, the evaporation mask 102 may be a shape of a strip. The evaporation mask 102 has a predetermined width and length. The width direction of the evaporation mask 102 is the first direction X. The stripe-shaped evaporation mask 102 includes the evaporation holes 105 for evaporation of the plurality of organic light emitting display panels. The extension direction of the evaporation mask 102 is the second direction Y. Here, the extension direction of the evaporation mask 102 is the extension direction of the strip. The second direction Y and the first direction X intersect each other. That is, the plurality of evaporation masks 102 are sequentially arranged along the first direction X, and the evaporation mask 102 extends along the second direction Y. Optionally, the first direction X and the second direction Y are perpendicular. Optionally, the frame 101 may be set as a rectangle, and the long and short sides of the rectangle are parallel to the first direction X and the second direction Y, respectively. The extension direction of the evaporation mask 102 is the second direction Y. That is, the evaporation mask 102 extends along a direction of one side of the rectangular frame. The plurality of evaporation masks 102 are sequentially arranged along a direction of the other side of the rectangular frame 101. This arrangement can realize the optimal arrangement of the evaporation masks 102, and more evaporation masks 102 can be arranged on the frame 101 of a specific shape.

In order to better realize the fixed connection between the evaporation masks 102 and the frame 101, one end in the extension direction of the evaporation mask 102 may be connected through the plurality of solder joints 104 arranged regularly. Optionally, the solder joints 104 are distributed in an array at both ends of the evaporation mask 102 along the second direction Y, respectively. The column and row directions of the array are parallel to the first direction X and the second direction Y, respectively. Under this condition, distances between the solder joints 104 in the same row (the row direction is the second direction Y) and the gap 103 closest to them are the same, and distances between the solder joints 104 in the same row and the edge of the evaporation mask 102 may be the same and the shortest first distance D1. Therefore, the gap between the two evaporation masks 102 can be beneficially reduced, a larger number of the evaporation masks 102 can be set in a unit area, and the layout rate of the evaporation masks 102 can be increased.

Figure 6:
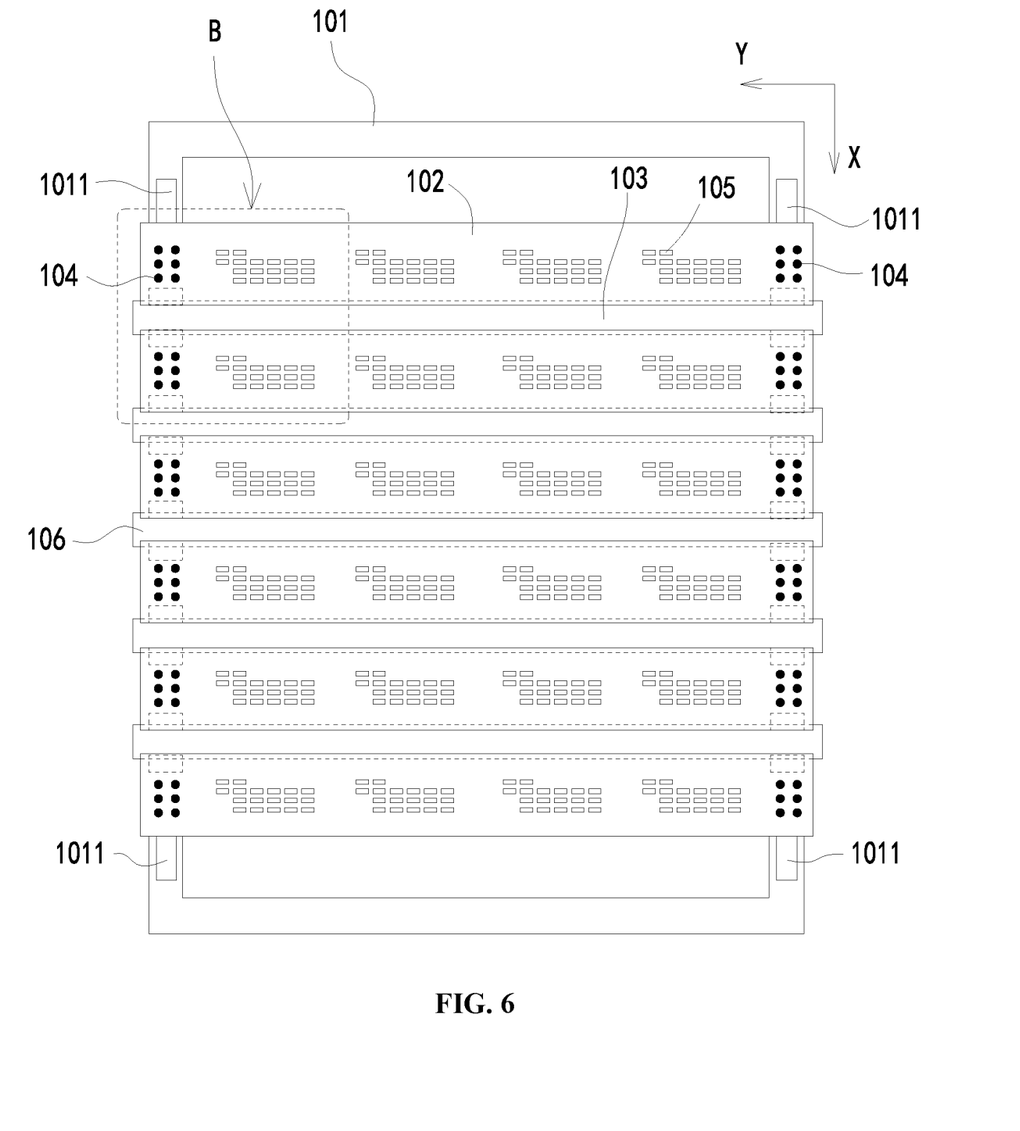
FIG. 6 is a schematic view of an overall structure of a mask assembly according to an embodiment of the present disclosure.

FIG. 6 is an overall structure of a mask assembly provided in an embodiment of the present disclosure. FIG. 7 is an enlarged schematic view of an area A of FIG. 6. Referring to FIG. 6 and FIG. 7 together, the same parts as in the above embodiment are not described here again, and the mask assembly of the embodiment may further include the cover mask 106. The cover mask 106 is used to cover the gap 103 between adjacent evaporation masks 102 and prevent the organic light-emitting material from being evaporated onto the glass substrate via the gap 103 between the adjacent evaporation masks during the evaporation process. The cover mask 106 can also be used to provide support for the evaporation masks 102, prevent the evaporation masks 102 from sagging, avoid deformation of the evaporation holes 105 on the evaporation mask 102, and ensure the evaporation accuracy of the evaporation holes 105 on the evaporation mask 102. The cover mask 106 is also fixed to the frame 101 by welding. In order to completely cover the gap 103, there is a partial overlap between the cover mask 106 and the evaporation mask 102. There is the third distance D3 in the first direction X between the edge of the covering mask 106 near the evaporation holes 105 and the evaporation hole closest to the gap, and the third distance D3 is 0.3 to 0.5 mm.

Figure 7:
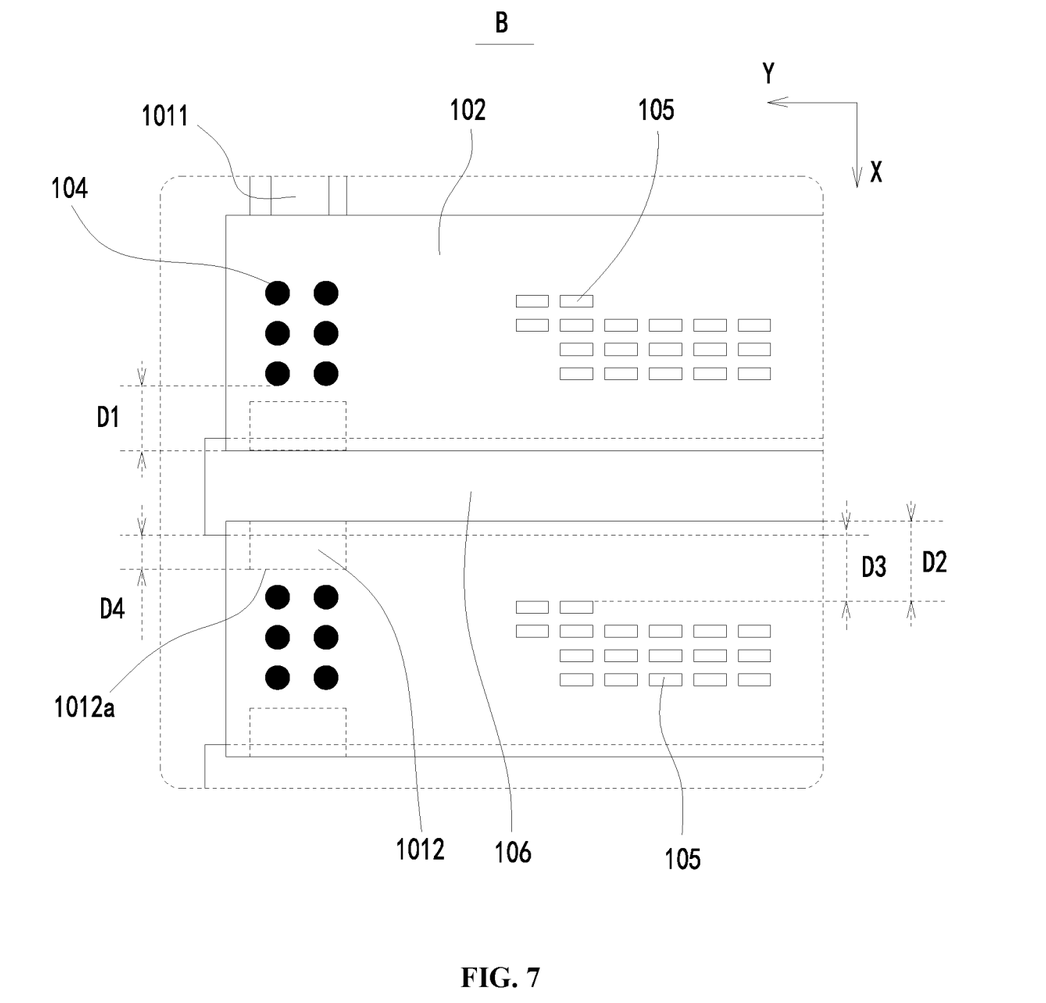
FIG. 7 is an enlarged schematic view of B in FIG. 6.

As shown in FIG. 7, in the first direction X, one covering mask 106 has two opposite edges. Both edges of the cover mask 106 are stacked with two adjacent evaporation masks 102, respectively. The distance between one of the plurality of evaporation holes 105 provided on one evaporation mask 102 closest to one edge of the adjacent covering mask 106 is the above third distance D3.

In the embodiment, by providing the third distance D3 of 0.3 to 0.5 mm in the first direction between the edge of the cover mask 106 near the evaporation hole 105 and the evaporation hole 105 closest to the gap 103, the gap between the two evaporation masks 102 can be advantageously reduced, or the size of the evaporation mask 102 in the first direction X is reduced, a larger number of evaporation masks 102 can be set in a unit area, and the layout rate per unit area of the evaporation masks 102 is improved. Optionally, in the embodiment, the cover mask 106 is in the shape of a strip and completely covers the gap 103 between the adjacent evaporation masks 102. The extension direction of the stripe-shaped cover mask 106 is the second direction Y, that is, the same as the extension direction of the evaporation mask 102.

In the embodiment, in a similar manner to the evaporation mask 102, the cover mask 106 can also be fixed to the frame 101 by welding. The portion of the frame 101 to be fixed to the evaporation mask 102 is provide with a plurality of protrusions 1011. The plurality of protrusions 1011 can be arranged along the first direction X. There is the groove 1012 between adjacent protrusions 1011. The evaporation masks 102 is fixed to the plurality of protrusions on the frame 101. Optionally, each end of one evaporation mask 102 may be fixed on one protrusion 1011. Since the evaporation mask 102 has a strip shape and extends along the second direction Y, the evaporation mask 102 is fixed on the protrusions 1011 oppositely disposed in the second direction Y, and the cover mask 106 is fixed in the groove 1012 between the adjacent protrusions 1011.

Understandably, the groove 1012 is formed by a certain distance between two adjacent protrusions 1011, so the groove 1012 has a long side 1012*a* formed by the adjacent protrusions 1011. The long side 1012*a* is the edge of each of the protrusions 1011 forming the groove 1012. The extension direction of the long side 1012*a* may be the second direction Y. As shown in FIG. 7, the cover mask 106 is in the groove 1012 formed by the long side 1012*a*, the long side 1012*a* is closest to one edge of the cover mask 106, and the fourth distance D4 lies between the long side 1012*a* and the edge of the cover mask 106 closest to it in the first direction X. The fourth distance D4 may be 0.3 mm, and the edge of the cover mask 106 is an edge extending along the second direction Y. By setting the fourth distance D4 to 0.3 mm, the gap between the two evaporation masks 102 can be reduced, and a larger number of evaporation masks 102 can be set in a unit area to improve the layout rate per unit area of the evaporation masks 102.

Further, an embodiment of the present disclosure further provides a evaporation method, including placing any one of the foregoing mask assembly on a target substrate, the target substrate is the large glass substrate in the foregoing embodiment, and the target substrate is evaporated via the above mask assembly.

In the mask assembly and the evaporation method provided in the present disclosure, as the structure of the evaporation masks 102 is reasonable, and the gap 103 between the two adjacent evaporation masks is reduced while satisfying the masking accuracy of the evaporation masks 102. Therefore, the layout number of the evaporation masks 102 in the mask assembly can be greatly improved, and the masking accuracy is improved, so that a larger number of display panels can be produced on a large glass substrate, which can increase a yield of the display panels and save costs.

Although the present disclosure has been described with reference to the preferred embodiments, various modifications can be made thereto and the components therein can be replaced with equivalents without departing from the scope of the disclosure, especially as long as there is no structural conflict, the technical features mentioned in the embodiments can be combined in any way. The present disclosure is not limited to the specific embodiments disclosed herein, but includes all technical solutions falling within the scope of the claims.

The invention claimed is:

1. A method of a mask layout, comprising:
   providing a frame with preset areas arranged at intervals, a positioning area between two adjacent preset areas, and a fixed area provided to offset from the positioning area and each of the preset areas, and a distance between two adjacent preset areas being a first predetermined distance L1;
   providing a cover mask corresponding to the positioning area, and a distance between an edge of the cover mask and the center of the positioning area being a second predetermined distance L2; and
   providing an evaporation mask on the fixed area according to preset conditions, a distance between two adjacent fixed areas being a third predetermined distance L3, and the third predetermined distance L3 being equal to a difference between the first predetermined distance L1 and the second predetermined distance L2;
   wherein the preset conditions comprise that the frame comprises a connection area for connecting the evaporation mask, the connection area is within each of the fixed areas, a distance between an edge of the connection area and an edge of the evaporation mask is a first distance D1, a distance between an edge of an evaporation area of the evaporation mask and the edge of the evaporation mask is a second distance D2, and the first distance D1 is smaller than the second distance D2.

2. The method of a mask layout according to claim 1, wherein the first distance D1 is 1 to 1.5 mm.

3. The method of a mask layout according to claim 1, wherein the second distance D2 is greater than 1.5 mm.

4. The method of a mask layout according to claim 1, wherein the preset conditions further comprise that there is a partial overlap between the cover mask and the evaporation mask, a distance between the edge of the cover mask near the evaporation area and the edge of the evaporation area is a third distance D3, a distance between an edge of the positioning area and the edge of the cover mask is a fourth distance D4, and the third distance D3 is greater than or equal to the fourth distance D4.

5. The method of a mask layout according to claim 4, wherein the third distance D3 is 0.3 to 0.5 mm.

6. The method of a mask layout according to claim 4, wherein the fourth distance D4 is 0.3 mm.

7. The method of a mask layout according to claim 1, wherein a width of each of the fixed areas is smaller than a width of each of the preset areas.

8. The method of a mask layout according to claim 1, wherein a width of the evaporation mask equals to a width of each of the fixed areas.

9. The method of a mask layout according to claim 1, wherein the evaporation area comprises an auxiliary pixel evaporation area, and a distance between an edge of the auxiliary pixel evaporation area and the edge of the evaporation mask is the second distance D2.

10. The method of a mask layout according to claim 1, wherein the frame comprises a protrusion provided in each of the fixed areas and a groove provided in the positioning area, the evaporation mask is fixed on the protrusion, and the cover mask is provided in the groove.

11. The method of a mask layout according to claim 10, wherein a solder joint is provided within the connection area, the evaporation mask is fixed to the protrusion by the solder joint, and a distance between an edge of the solder joint and the edge of the evaporation mask is the first distance D1.

12. The method of a mask layout according to claim 11, wherein the number of solder joints is plural, and a distance between the edge of each of the solder joints closest to the cover mask and the edge of the evaporation mask is the first distance D1.

13. The method of a mask layout according to claim 11, wherein the number of protrusions is plural, and a plurality of protrusions are arranged along a width direction of the evaporation mask, the groove is provided between two adjacent protrusions, and a plurality of evaporation masks are fixed on the plurality of protrusions, respectively.

14. The method of a mask layout according to claim 1, wherein the evaporation mask is in a shape of a strip.

15. The method of a mask layout according to claim 14, wherein a plurality of preset areas are disposed at intervals in a width direction of the evaporation mask.

16. The method of a mask layout according to claim 14, wherein a plurality of evaporation masks are sequentially disposed on the frame in its width direction, there is a gap between two adjacent evaporation masks, and the covering mask is used to cover the gap.

17. The method of a mask layout according to claim 16, wherein the gap between the two adjacent evaporation masks is smaller than the first predetermined distance L1.

18. The method of a mask layout according to claim 2, wherein the preset conditions further comprise that there is a partial overlap between the cover mask and the evaporation mask, a distance between the edge of the cover mask near the evaporation area and the edge of the evaporation area is a third distance D3, a distance between an edge of the positioning area and the edge of the cover mask is a fourth distance D4, and the third distance D3 is greater than or equal to the fourth distance D4.

19. The method of a mask layout according to claim 2, wherein a width of each of the fixed areas is smaller than a width of each of the preset areas.

20. The method of a mask layout according to claim 2, wherein a width of the evaporation mask equals to a width of each of the fixed areas.

\* \* \* \* \*